(12) United States Patent
Kumaria et al.

(10) Patent No.: US 9,186,741 B2
(45) Date of Patent: Nov. 17, 2015

(54) INDUCTION SOLDERING OF PHOTOVOLTAIC SYSTEM COMPONENTS

(75) Inventors: Shashwat Kumaria, Sunnyvale, CA (US); Briccio de Leon, San Pablo (PH)

(73) Assignee: SunPower Corporation, San Jose, CA (US)

( * ) Notice: Subject to any disclaimer, the term of this patent is extended or adjusted under 35 U.S.C. 154(b) by 1830 days.

(21) Appl. No.: 12/558,095

(22) Filed: Sep. 11, 2009

(65) Prior Publication Data

US 2011/0062148 A1    Mar. 17, 2011

(51) Int. Cl.
*B23K 1/002*    (2006.01)
*B23K 1/00*     (2006.01)
*H01L 31/18*    (2006.01)

(52) U.S. Cl.
CPC ............ *B23K 1/002* (2013.01); *B23K 1/0016* (2013.01); *H01L 31/188* (2013.01); *B23K 2201/40* (2013.01); *Y02E 10/50* (2013.01)

(58) Field of Classification Search
CPC .. H01L 31/188; B23K 2201/40; B23K 1/002; B23K 1/0016; Y02E 10/50

USPC .......................................... 219/616; 136/244
See application file for complete search history.

(56) References Cited

U.S. PATENT DOCUMENTS

| | | | |
|---|---|---|---|
| 2006/0147221 A1* | 7/2006 | Asakura et al. | 399/69 |
| 2007/0283995 A1* | 12/2007 | Okamoto et al. | 136/244 |
| 2010/0038358 A1* | 2/2010 | Dingle et al. | 219/616 |
| 2013/0277361 A1* | 10/2013 | Tan et al. | 219/616 |
| 2015/0048078 A1* | 2/2015 | Morf et al. | 219/616 |

* cited by examiner

*Primary Examiner* — Mohammad Islam
*Assistant Examiner* — John P Dulka
(74) *Attorney, Agent, or Firm* — Okamoto & Benedicto LLP

(57) ABSTRACT

A method comprises positioning a pair of photovoltaic wafers in a side-by-side arrangement. An interconnect is placed on the pair of wafers such that the interconnect overlaps both wafers of the pair, solder material being provided between the interconnect and the respective wafers. A solder head is then located adjacent the interconnect, and the coil is energized to effect inductive heating of the solder material. The solder head comprises an induction coil shaped to define an eye, and a magnetic field concentrator located at least partially in the eye of the coil. The magnetic field concentrator defines a passage extending axially through the eye of the coil, and may be of a material with a high magnetic permeability.

12 Claims, 8 Drawing Sheets

US 9,186,741 B2

INDUCTION SOLDERING OF PHOTOVOLTAIC SYSTEM COMPONENTS

GOVERNMENT FUNDING

The invention described herein was made with Governmental support under contract number DE-FC36-07G017043 awarded by the United States Department of Energy. The Government may have certain rights in the invention.

TECHNICAL FIELD

The present application relates generally to the technical field of induction soldering of photovoltaic system components. Embodiments include a system and apparatus to connect photovoltaic wafers by induction soldering.

BACKGROUND

Photovoltaic systems, which serve to convert solar energy to electrical energy, often include solar panels comprised of multiple photovoltaic wafers which are electrically connected. Such electrical connection of adjacent or neighbouring wafers in a panel may be provided by a metal connector or interconnect, which is connected by soldering to electrical contacts on the respective wafers.

The soldering connection of the interconnect to a pair of wafers may be performed by induction soldering, in which an induction coil is positioned proximate a contact that is to be soldered to the interconnect. A magnetic field is then generated by the coil due to electrical current passing through the coil, the coil being positioned such that solder material located between the interconnect and the electrical contact melts because of inductive heating of the interconnect and the solder material by the magnetic field.

SUMMARY

In accordance with one embodiment, there is provided a method which comprises positioning a pair of photovoltaic wafers in a side-by-side arrangement; placing a interconnect on the pair of wafers such that the interconnect overlaps both wafers of the pair, solder material being provided between the interconnect and the respective wafers; locating a solder head adjacent the interconnect; and energizing the coil to effect inductive heating of the solder material. The solder head comprises an induction coil shaped to define an eye, and a magnetic field concentrator located at least partially in the eye of the coil, the magnetic field concentrator defining a passage extending axially through the eye of the coil. The solder head may be of a material with a high magnetic permeability.

The passage of the magnetic field concentrator may be circular cylindrical, and the magnetic field concentrator may comprise an annular cylindrical core component extending through the eye of the coil. The magnetic field concentrator may further include an annular shoulder resting on the coil to locate the core component in the eye of the coil.

In accordance with another embodiment, there is provided an apparatus which comprises an induction coil shaped to define an eye; a magnetic field concentrator located at least partially in the eye of the coil, the magnetic field concentrator defining a passage extending axially through the eye of the coil; a support surface to hold at least two photovoltaic wafers in a substantially co-planar, edge-to-edge relationship; and a control arrangement to position the coil adjacent the support surface such that the coil lies in a plane which is substantially parallel to and transversely spaced from the support surface.

Yet a further embodiment provides an apparatus which comprises an induction coil shaped to define an eye, and a magnetic field concentrator located at least partially in the eye of the coil, outer walls of the magnetic field concentrator in a plane of the coil lying within the eye of the coil, the magnetic field concentrator defining a passage extending axially through the eye of the coil.

BRIEF DESCRIPTION OF DRAWINGS

Some embodiments are illustrated by way of example and not limitation in the figures of the accompanying drawings in which.

DETAILED DESCRIPTION

Example apparatuses and methods for connecting photovoltaic wafers are described. In the following description, for purposes of explanation, numerous specific details are set forth in order to provide a thorough understanding of example embodiments. It will be evident, however, to one skilled in the art that the embodiments may be practiced without these specific details.

Figure 1:
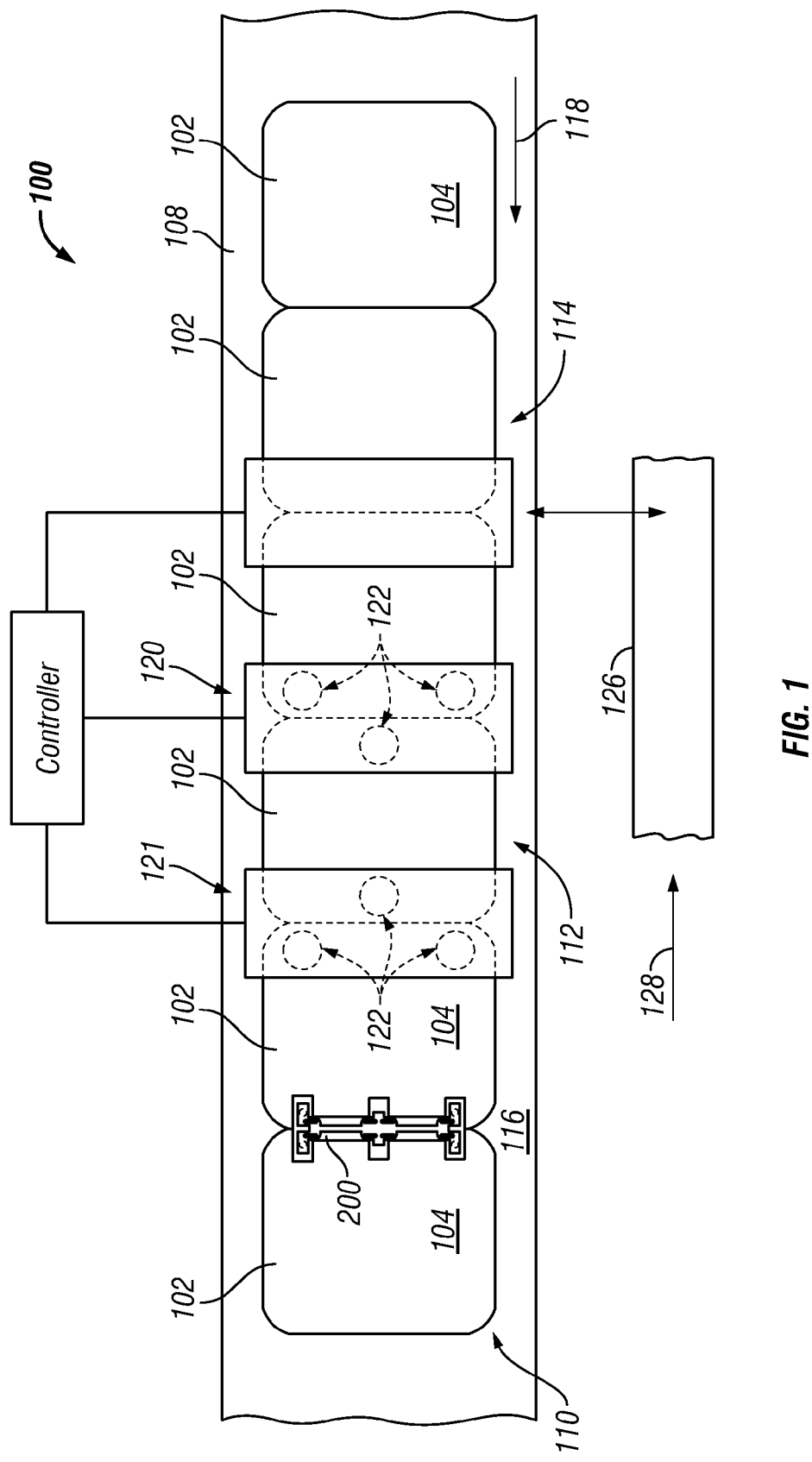
FIG. 1 is a schematic top view of an apparatus to connect photovoltaic wafers by induction soldering.
Figure 2:
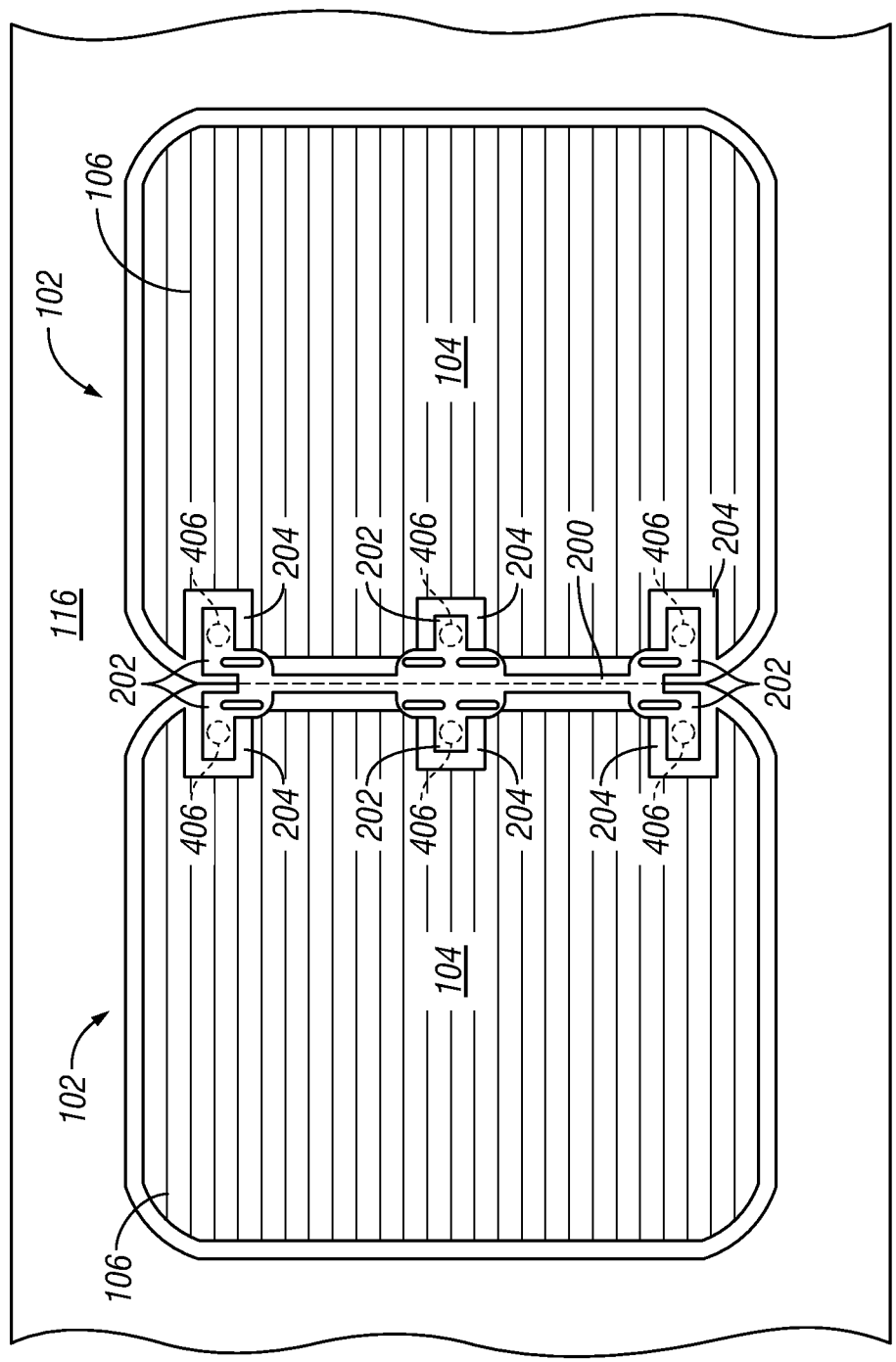
FIG. 2 is, on an enlarged scale, a top view of a pair of photovoltaic wafers that are to be connected by induction soldering, the wafers including an electrical interconnect placed in position for soldering.

In FIG. 1 of the drawings, reference numeral 100 generally indicates a machine or apparatus in accordance with an example embodiment. The apparatus 100 serves to connect photovoltaic wafers 102 for the formation of photovoltaic panels. It will be appreciated that the photovoltaic wafers 102 are thin and flat, having opposite major faces. One of the major faces of each wafer 102 is an active face (not shown) that is photovoltaically active for operative generation of electrical power by exposure to sunlight, while the other major face, or back 104, of the wafer 102 includes circuitry 106 (see FIG. 2) to conduct electricity generated by the wafer 102 due to exposure of the active face to sunlight. In other embodiments, photovoltaic wafers or components that have electrical circuitry on not only one, but on both of its major faces may be interconnected. In such cases, each wafer or component may be electrically connected to an adjacent wafer or component by an interconnecting member or ribbon which connects an electrical element or contact on a rear face of the wafer to an electrical element or contact on the front face of the adjacent wafer. The apparatus 100 includes a feed mechanism 108 to feed a string 110 of wafers 102 successively to an interconnect placement station 114 and a soldering station 112. The string 110 comprises wafers 102 which rest on an elongated planar support surface or bed 116 which is oriented horizontally, the wafers 102 being arranged in a longitudinally extending series of aligned wafers 102 which are positioned edge-to-edge. Although not evident in the drawings, the wafers 102 are positioned such that they do not touch and are thus non-contiguous. The opposed edges of a pair of adjacent wafers 102 are therefore spaced apart or separated by a small gap. Each pair of adjacent wafers 102 are thus arranged in an edge-to-edge, co-planar relationship, as can be seen in FIG. 2, for example. The feed mechanism 108 feeds the string 110 in periodic indexed movements in the direction of the arrow indicating feed direction 118.

The soldering station 112 serves, in use, to connect adjacent wafers 102 electrically by soldering a connector or interconnect 200 (shown in greater detail in FIG. 2) to both of the adjacent wafers 102. As is illustrated in FIG. 2, which, for ease of illustration, shows a pair of the wafers 102 of the string 110 in isolation, the interconnect 200 is positioned along abutting edges of the wafers 102, so that the interconnect 200 overlaps both wafers 102. The interconnect 200 is of an electrically conductive metal plate or sheet material. The interconnect 200 is elongated, having a central spine with three pairs of opposed, laterally projecting tongues or tabs 202 spaced along its length. In particular, the interconnect 200 has a pair of tabs 202 at each end, and a pair of tabs 202 located centrally.

When the interconnect 200 is placed in position, being longitudinally aligned with an abutting seam or join of the wafers 102, each of the tabs 202 is in register with an associated electrical termination or contact 204 provided on the back 104 of the wafer 102. Soldering of tabs 202 of the interconnect 200 to the respective contacts 204 of the wafers 102 connects the wafers 102 together electrically, via the interconnect 200.

Referring back to FIG. 1, the soldering station 112 may comprise first cluster 120 and second cluster 121 of solder heads 122. Each solder head 122 serves to solder one of the interconnect 200's tabs 202 to its associated contact 204 by inductive heating, as described in greater detail below. In the illustrated embodiment, the soldering station 112 comprises six solder heads 122, three in each cluster 120, 121. First cluster 120 and second cluster 121 are spaced in the feed direction 118 by a distance equal to the length of one of the wafers 102. As can best be seen in FIG. 1 of the drawings, the solder heads 122 of the first cluster 120 are arranged respectively to be in register with three of the registering tab-contact pairs, while the solder heads 122 of the second cluster 121 is in register with the remaining three tab-contact pairs. The solder heads 122 of each cluster 120, 121 are mounted on a common carriage for synchronized movement and actuation.

Figure 3:
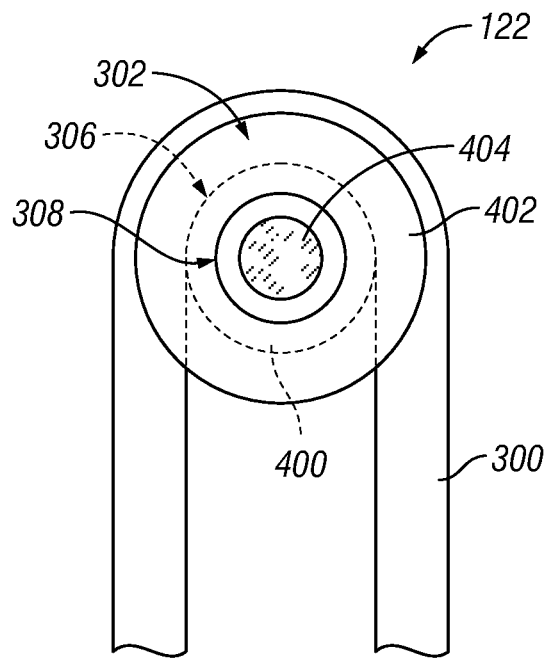
FIG. 3 is, on an enlarged scale, a top view of a solder head forming part of an apparatus according to an example embodiment.
Figure 4:
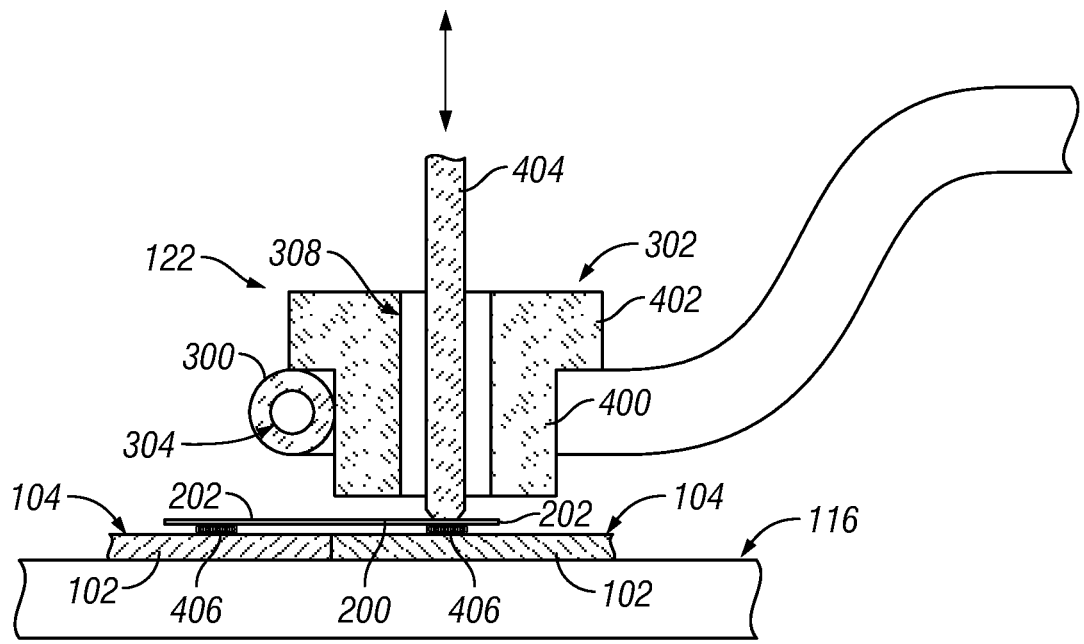
FIG. 4 is a sectional side view of a solder head according to an example embodiment, during operation.

FIGS. 3 and 4 show in greater detail a single one of the solder heads 122 according to one embodiment. The solder head 122 may comprise an induction winding or coil 300 and a magnetic field concentrator 302. The induction coil 300 may be a hollow conduit of electrically conductive material, in the illustrated embodiment being a copper pipe having a hollow interior 304 for channeling cooling liquid pumped through it, in use. The copper pipe may have a curved shape, forming a single elongated U-shaped winding or coil 300, lying substantially in an operatively horizontal plane; however, it is to be appreciated that, in other embodiments, the coil 300 may have multiple windings or loops, may be helical in shape, or may have any other shape or arrangement suitable for induction soldering. The coil 300 may therefore include a part-circular portion, in the illustrated embodiment being semi-circular at the rounded end of its U-shaped profile, thus defining an opening or eye 306 (FIG. 3). Being an induction coil, the coil 300 is operably connected to an electrical power source and switching arrangement to selectively energize the coil 300 by passing electrical current therethrough, thereby generating a magnetic field around the coil 300, the flux of the magnetic field being greatest at the centre of the eye 306. In the example embodiment, the coil 300 is energized by an alternating electric current.

The field concentrator 302 is mounted on the coil 300 such that the field concentrator 302 is located partially in the eye 306 of the coil 300. As can best be seen in FIG. 4, the field concentrator 302 may comprise a circular cylindrical shank or core component 400 which extends axially through the eye 306, thus being oriented vertically, in operation. At an upper end of the core component 400, the field concentrator 302 has a circumferentially extending, radially outwardly projecting annular shoulder 402 which rests on the coil 300 to locate the core component 400 in the eye 306. The core component 400 is positioned such that it is co-axial with the coil 300, being concentric with the eye 306 in top view (FIG. 3). The outer diameter of the core component 400 may be somewhat smaller that an internal diameter of the eye 306, so that the core component 400 is a sliding fit in the eye 306. The field concentrator 302 defines an elongated cavity or passage 308 (FIGS. 3 and 4) which extends axially through the field concentrator 302, the passage 308 being circular cylindrical and being located co-axially with the core component 400 and the eye 306 of the coil 300, so that the core component 400 is effectively annular cylindrical with the passage 308, coinciding with the centre of the eye 306. As can be seen in FIG. 4, the core component 400 projects downwards beyond the coil 300. It is to be noted that, in a plane of the coil 300, the field concentrator 302 lies wholly within the eye 306 of the coil 300, and that the field concentrator 302 does not project radially beyond the inner diameter of the coil 300 but for the shoulder 402, which is located above the coil 300.

The core component 400 is of a paramagnetic material, or is of a material with high magnetic permeability, in this embodiment being of a soft magnetic material in the form of Fluxtrol™ Ferrotron 559H magnetic material. As used herein, the term "high magnetic permeability" means a material having a relative permeability of greater than 4. Relative permeability is the ratio of a material's permeability relative to the permeability of a vacuum. In some embodiments, the relative permeability of the field concentrator may be greater than 15. The material of the core component 400 in the example embodiment has an initial permeability of 16 and a maximum permeability of 18.

In the example embodiment, the coil 300 and the field concentrator 302 are connected together to form a solder head 122 which is of unitary construction and operates structurally and functionally as a unit, but it is to be appreciated that, in other embodiments, a coil and a field concentrator may be separately movable. In such case, even if the field concentrator is positioned in the eye of the coil only when inductive heating is to be performed, the coil and field concentrator combination, when brought into position for soldering, falls within the meaning of the term "solder head" as used herein.

Each solder head 122 further includes an actuated hold-down pin 404 which is co-axially located in the passage 308 and is axially displaceable along the passage 308 to press an interconnect 200 downwards on to the underlying wafer 102. The hold-down pin 404 may be of a diamagnetic material, thus being weakly susceptible to magnetization, at best. In the embodiment of FIG. 4, the hold-down pin 404 is of a ceramic material, but in other embodiments the hold-down pin 404 may be of a polymeric plastics material, or of another material having similar magnetic properties.

Turning again to FIG. 1, the apparatus 100 further includes an interconnect string feeder to feed a string 126 of interconnect material in the direction of arrow 128, towards the interconnect placement station 114. The interconnect placement station 114 is arranged for reciprocating displacement perpendicular to the feed direction 118, to remove one interconnect 200 at a time from the interconnect string 126 by punching it from the interconnect string 126, and to place the interconnect 200 in position (as shown in FIG. 2).

In operation, the feed mechanism 108 displaces the series of wafers 102, arranged in abutting single file, in the feed direction 118. The wafers 102 are displaced at regular intervals and the displacement is indexed so that each pair of adjacent wafers 102 is, in sequence, brought into register with the interconnect placement station 114, the first cluster 120 of solder heads 122, and the second cluster 121 of solder heads 122. Each periodic or intermittent displacement is thus equal to the length of an individual wafer 102, while the period of interval between successive displacements may be about 4 seconds.

Upstream of the interconnect placement station 114, solder material in the form of solder paste 406 (FIGS. 2 and 4) is placed on each of the six electrical contacts 204 adjacent the abutting edges of a pair of wafers 102. In other example embodiments, the solder material may alternatively include solder pre-forms or metal interconnects with solder plating. Although not illustrated, the apparatus 100 includes a mechanism to deposit the solder paste 406 in an automated manner. In conventional fashion, the solder paste 406 is comprised of powdered metal solder suspended in a thick medium.

Thereafter, the wafers 102 are moved to the interconnect placement station 114, where a interconnect 200 is punched from the interconnect string 126 and placed on the abutting edges of the wafers 102, as shown in FIG. 2. As can be seen, each tab 202 of the interconnect 200 is placed atop a corresponding contact 204, with solder paste 406 sandwiched between each tab 202 and its corresponding contact 204.

Figure 5:
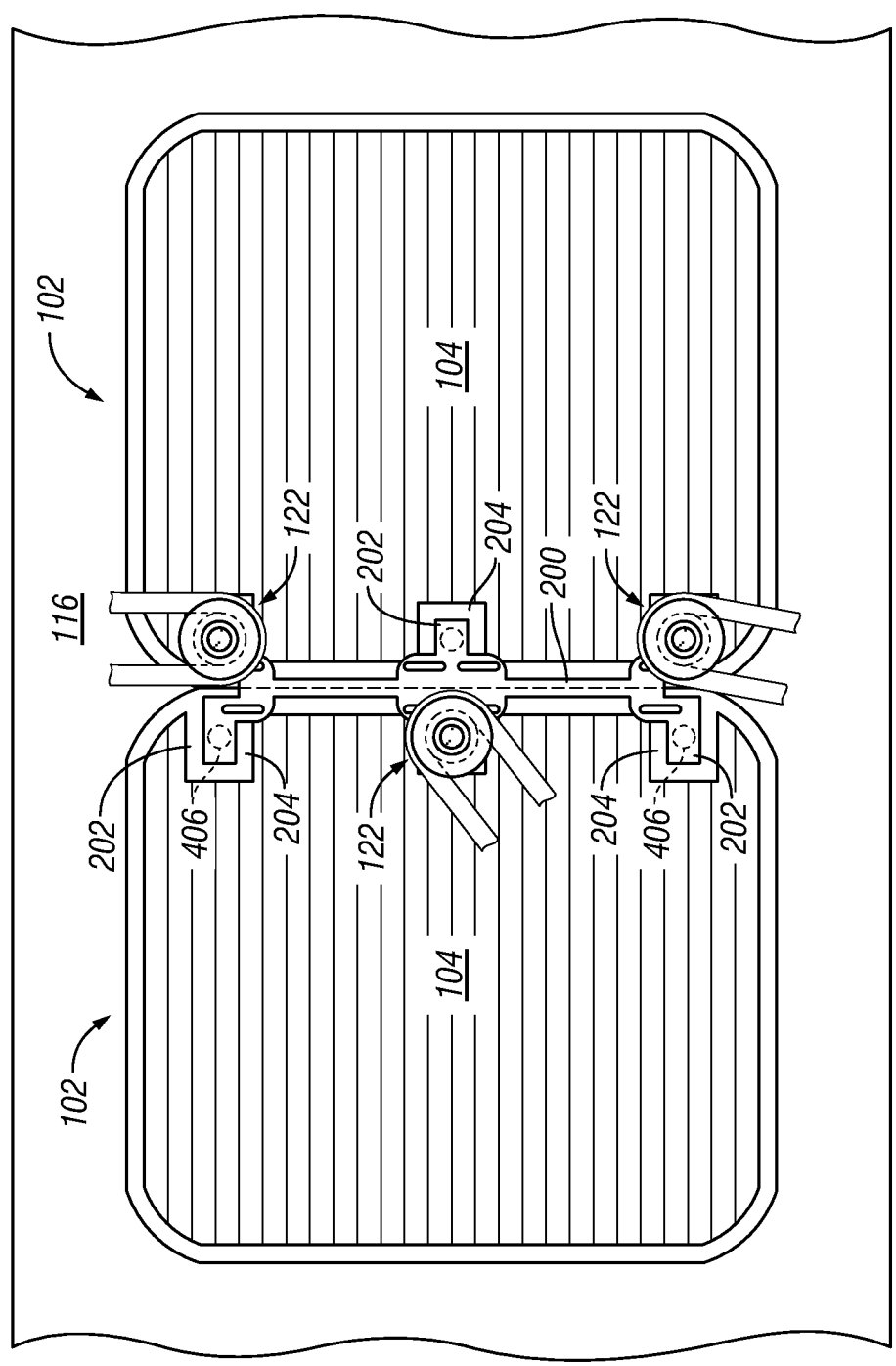
FIG. 5 is a top view corresponding to that of FIG. 2, including three solder heads positioned over respective contacts for induction soldering.

Next, the wafers 102 are moved in the feed direction 118 to the first cluster 120 of solder heads 122 where three solder heads 122 are brought into position over three of the tabs 202, as illustrated in FIG. 5. Each solder head 122 is positioned such that the central passage 308 (FIG. 4) of the field concentrator 302, and therefore the hold-down pin 404, is in register with the associated tab 202 in general, and may be in register with the deposit of solder paste 406 on the corresponding contact 204. The solder heads 122 are then lowered to such a height that they are closely spaced from an upper surface of the interconnect 200. A vertical spacing between the lower surface of the field concentrator 302 and the upper surface of the interconnect 200 may, in one embodiment, be 1-5 mm, in the embodiment of FIG. 4 being about 2 mm. The hold-down pin 404 is then moved axially downwards on to the interconnect 200, pressing the associated tab 202 of the interconnect 200 on to its contact 204, to hold the interconnect 200 in position during soldering and to ensure proper contact of the solder paste 406 with both the interconnect 200 and the contact 204. Operation of the three solder heads 122 and their hold down pins 404 is synchronized.

The coil 300 of each solder head 122 is then energized by passing electrical current therethrough. The electrical current in the coil 300 results in the generation of a magnetic field by the coil 300, the magnetic field having a zone of highest flux density in the eye 306 of the coil 300. The field concentrator 302 is magnetized by the magnetic field to which it is exposed, and due at least in part to the annular shape of the core component 400, the magnetic field is concentrated at the passage 308. The magnetic field heats the solder paste 406 past its melting point, at least partly by inductive heating, thus soldering the tab 202 of the interconnect 200 to its associated contact 204 and providing an electrically conductive connection between the interconnect 200 and the respective contacts 204. The solder paste 406 is heated not only by induction, but it is also conductively heated by the interconnect 200, which is itself inductively heated due to its exposure to the magnetic field.

It is to be appreciated that the magnetic field in and beneath the passage 308 is more concentrated than would be the case if the field concentrator 302 were to be omitted. Therefore, a zone or area on the interconnect 200 and contact 204 directly beneath the passage 308, including the solder paste 406, experiences a more concentrated magnetic field and therefore higher flux density than would otherwise be the case. Differently worded, a so-called footprint of the magnetic field on the work piece is constricted or concentrated by the field concentrator 302 and thus reduces wasted heating of materials outside of a target zone represented by the solder paste 406, so that the field concentrator 302 results in more targeted application of inductive energy generated by the coil 300.

After soldering at the first cluster 120, the interconnect 200 is released by lifting the hold-down pins 404 longitudinally upwards, and lifting of the solder heads 122. The wafers 102 are then moved to the second cluster 121 of solder heads 122. As can best be seen in FIG. 1, the solder heads 122 of the second cluster 121 are positioned complementarily to those of the first cluster 120, to solder the remaining three contacts 204. The soldering process described above is repeated at the second cluster 121, after which the interconnect 200 is fully connected to the associated pair of wafers 102. Thus, a series of wafers 102 are connected to form the string 110 of wafers 102, which may be used in the manufacture or formation of solar panels.

Due to the more concentrated magnetic field resulting from the shape, configuration, and arrangement of the field concentrator 302, which causes exposure of the solder paste 406 to higher flux densities, the solder heads 122 of the apparatus 100 has increased effectiveness in inductive heating of the solder paste 406. Such increased induction efficiency may be used to reduce the soldering time by heating the solder paste 406 at a greater rate, or it may be used to reduce electrical power consumption of the coils 300, or a combination of power reduction and solder time reduction may be achieved.

Figure 6A:
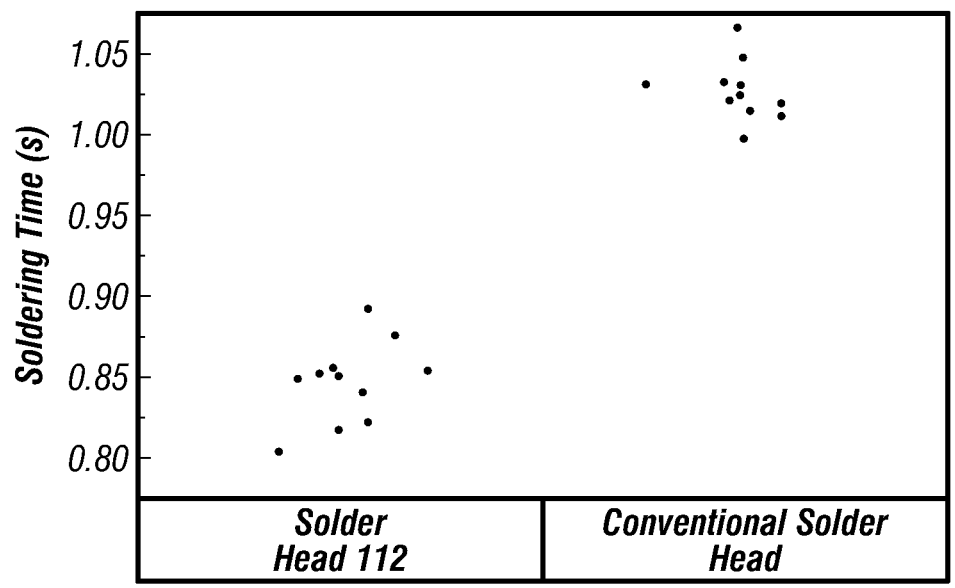
FIGS. 6A-6C show a series of charts plotting the results of experimental comparison between soldering performed respectively by a conventional induction coil and a solder head, according to an example embodiment.
Figure 6B:
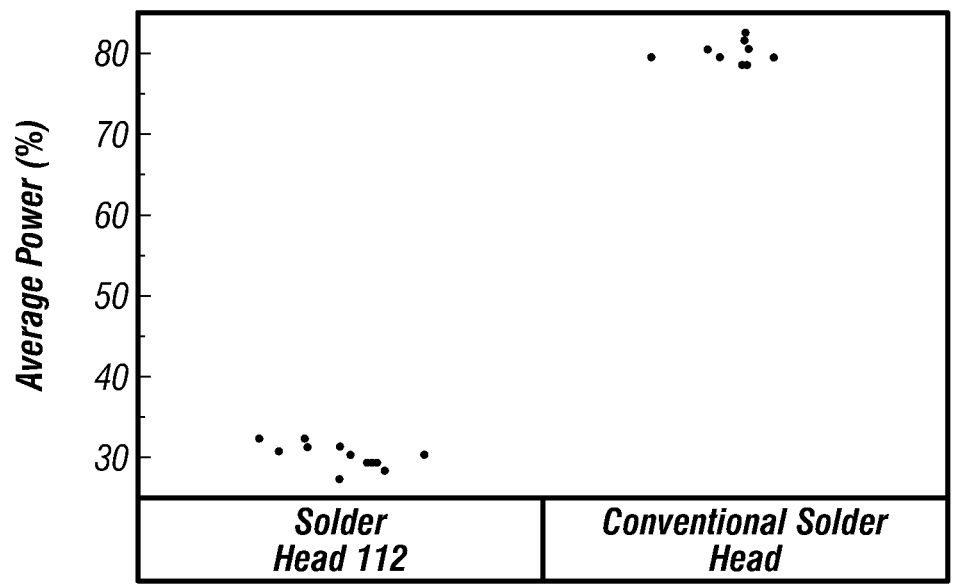
Figure 6C:
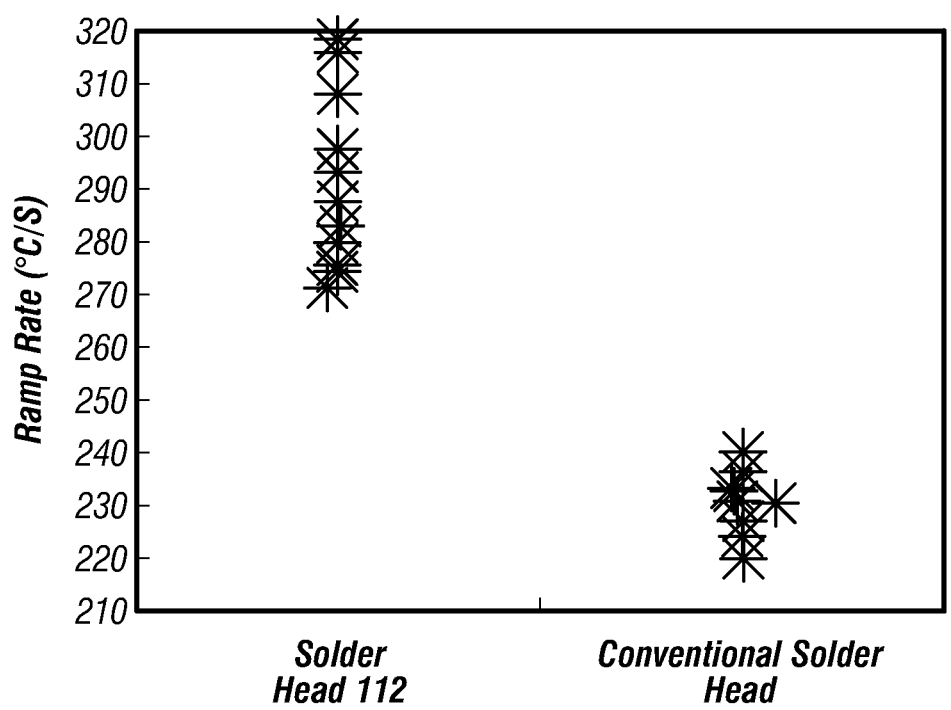

FIGS. 6A-6C illustrate the results of a test comparison between the performance of, on the one hand, a solder head 122 according to the example embodiment described above, and, on the other hand, a solder head having an identical coil 300 but without the field concentrator 302, further referred to as "the conventional coil" for ease of reference. In this example test, the current and voltage range for both tested coils were 16 A max and 180-260V AC, while the operating frequency was 50-60 Hz. Both coils were used to solder a test run of interconnects 200 to wafers 102 by inductive heating of solder paste 406 to a temperature of 230° C. As can be seen in FIG. 6A, the soldering time of the conventional coil was about 1 ms, while the soldering time of the solder head 122 was about 0.85 ms. This represents a reduction of about 20% in soldering time. FIG. 6B charts the average power consumption of the solder head 122 and the conventional coil respectively during the test. The average power consumption of the solder head 122 was 30% of absolute value as compared to an average power consumption of about 80% of absolute value for the conventional coil. Thus, a relative reduction of about 60% in power consumption was found. Finally, FIG. 6C charts comparative ramp rates of soldering paste heated by the respective coils. While the conventional coil heated soldering paste at a ramp rate of about 230° C./s, the solder head 122 heated the paste at an average ramp rate of about 290° C./s.

It will be appreciated that the feed rate of the string 110 of wafers 102 is limited by the soldering time at the soldering station 112. Reduced soldering time due to a greater ramp rate permits shortening of the regular interval or period at which the string 110 of wafers 102 is fed, resulting in greater throughput of the apparatus 100, while reducing energy consumption.

Figure 7A:
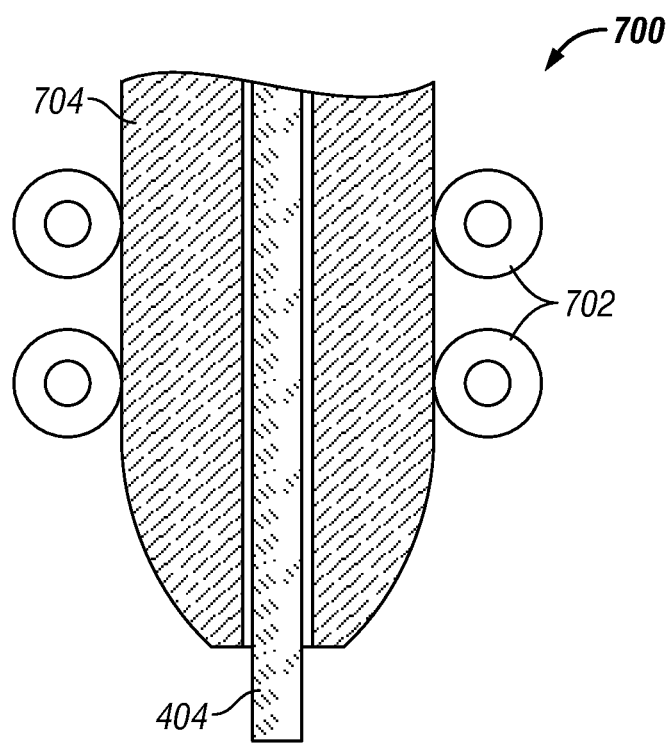
FIGS. 7A-7D are respective sectional side views of solder heads according to other example embodiments.

Further embodiments of a solder head are shown in FIGS. 7A-7D. Like reference numerals indicate like parts in FIGS. 1-6 and in FIGS. 7A-7D, unless otherwise indicated. FIG. 7A shows a solder head 700 having a helically wound coil 702 with two windings. An elongated field concentrator 704 of soft magnetic material extends axially through an eye 706 of the coil. The field concentrator 704 is circular cylindrical, being more or less barrel-shaped and being tapered at its lower end. The hold-down pin 404 is co-axially slidable along the field concentrator 704.

Figure 7B:
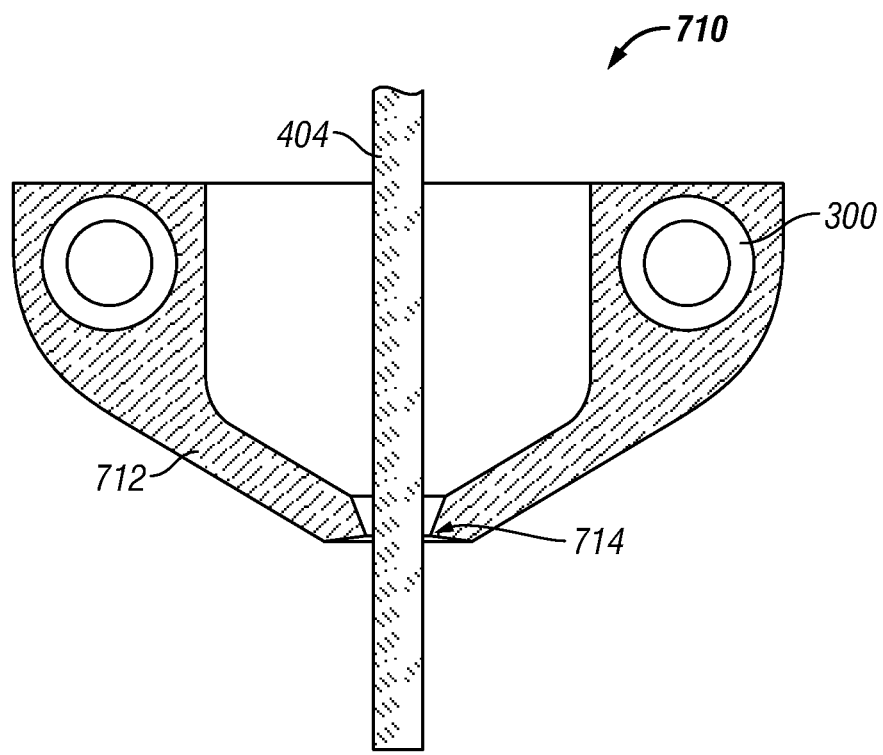

FIG. 7B shows another embodiment of a solder head 710. The solder head 710 includes a field concentrator 712 which encases the coil 300, so that the coil 300 is surrounded by the field concentrator 712, when seen in cross-sectional view. In contrast to the solder head 122 of FIGS. 1-6, the field concentrator 712 therefore does not lie wholly inside the eye of the coil 300, when viewed in the plane of the coil 300. The field concentrator 712 is roughly cup-shaped, having a hollow circular cylindrical interior which narrows conically to an opening 714 co-axial with the coil 300. The hold-down pin 404 is longitudinally slidable through the opening 714.

Figure 7C:
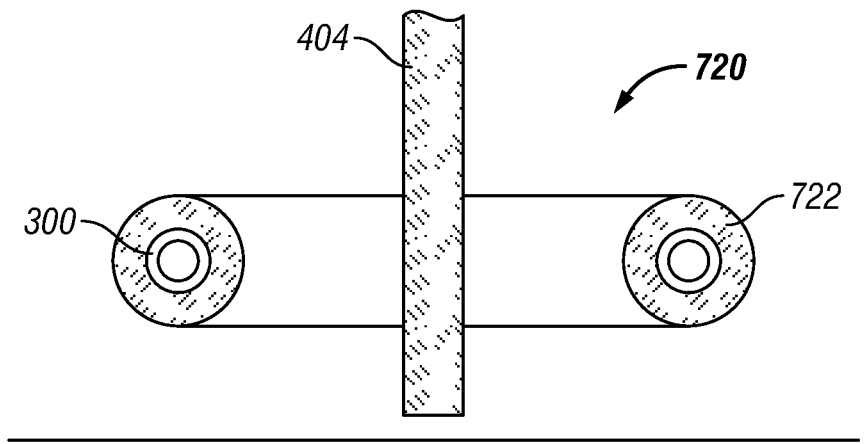
Figure 7D:
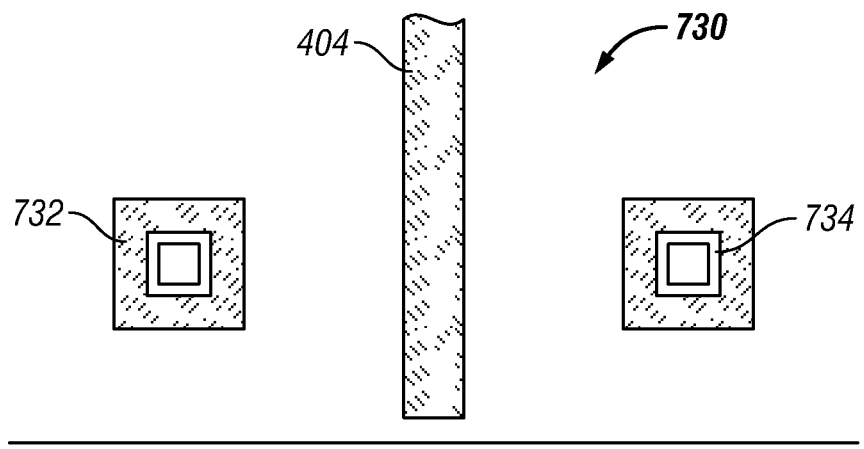

A further embodiment of a solder head 720 illustrated in FIG. 7C has a coil 300 surrounded by a field concentrator 722, which is co-axial with the pipe material of the coil 300 when seen in cross-section, the field concentrator 722 surrounding the coil 300. The coil 300 and the field concentrator 722 have circular cross-sectional outlines, so that the field concentrator 722 is part-toroidal or doughnut-shaped. In such case walls of a passage formed by the field concentrator 722 are thus convexly curved. The hold-down pin 404 is located co-axially in an eye defined by a part-circular winding of the coil 300. FIG. 7D shows yet a further embodiment of a solder head 730 which corresponds largely to the solder head 720 of FIG. 7C, with the difference that the cross-sectional outlines of a co-axial coil 734 and field concentrator 732 are square.

Thus, an apparatus and method to connect photovoltaic wafers by induction soldering have been described. Although specific example embodiments have been described, it will be evident that various modifications and changes may be made to these embodiments. Accordingly, the specification and drawings are to be regarded in an illustrative rather than a restrictive sense.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method comprising:
    positioning a pair of photovoltaic wafers in a side-by-side arrangement;
    placing an interconnect on the pair of wafers such that the interconnect overlaps both wafers of the pair, a solder material being provided between the interconnect and the respective wafers;
    locating a solder head adjacent the interconnect, the solder head comprising: an induction coil shaped to define an eye, and a magnetic field concentrator located at least partially in the eye of the coil, the magnetic field concentrator defining a passage extending axially through the eye of the coil; and
    energizing the coil to effect inductive heating of the solder material,
    wherein the magnetic field concentrator comprises an annular cylindrical core component extending through the eye of the coil, having an annular shoulder at an operatively upper end of the core component, the annular shoulder resting on the coil to locate the core component in the eye of the coil.

2. The method of claim 1, wherein the magnetic field concentrator is of a material with a high magnetic permeability.

3. The method of claim 1, wherein the positioning of the pair of wafers is such that the wafers are co-planar and edge-to-edge, the locating of the solder head being such that the coil is transversely spaced from the interconnect, the passage of the magnetic field concentrator extending transversely a common plane of the wafers and being in register with a deposit of solder material.

4. The method of claim 1, further comprising locating a plurality of solder heads adjacent the interconnect, each solder head being positioned in register with an associated electric contact forming part of one of the pair of wafers, and synchronously energizing coils of the plurality of solder heads.

5. The method of claim 1, further comprising, prior to the energizing of the coil, pressing the interconnect on to the wafers with a hold-down member which is axially displaceable through the passage in the magnetic field concentrator.

6. The method of claim 1, wherein the magnetic field concentrator houses at least part of the coil such that the coil is surrounded by the magnetic field concentrator, when viewed in cross section.

7. A method comprising:
    positioning a pair of photovoltaic wafers in a side-by-side arrangement;
    placing an interconnect on the pair of wafers such that the interconnect overlaps both wafers of the pair, a solder material being provided between the interconnect and the respective wafers;
    locating a solder head adjacent the interconnect, the solder head comprising: an induction coil shaped to define an eye, and a magnetic field concentrator located at least partially in the eye of the coil, the magnetic field concentrator defining a passage extending axially through the eye of the coil; and
    energizing the coil to effect inductive heating of the solder material,
    wherein the magnetic field concentrator houses at least part of the coil such that the coil is surrounded by the magnetic field concentrator, when viewed in cross section.

8. The method of claim 7, wherein the magnetic field concentrator is of a material with a high magnetic permeability.

9. The method of claim 7, wherein the positioning of the pair of wafers is such that the wafers are co-planar and edge-to-edge, the locating of the solder head being such that the coil is transversely spaced from the interconnect, the passage of the magnetic field concentrator extending transversely a common plane of the wafers and being in register with a deposit of solder material.

10. The method of claim 7, wherein the magnetic field concentrator comprises an annular cylindrical core component extending through the eye of the coil, and having an annular shoulder at an operatively upper end of the core component, the annular shoulder resting on the coil to locate the core component in the eye of the coil.

11. The method of claim 7, further comprising locating a plurality of solder heads adjacent the interconnect, each solder head being positioned in register with an associated electric contact forming part of one of the pair of wafers, and synchronously energizing coils of the plurality of solder heads.

12. The method of claim 7, further comprising, prior to the energizing of the coil, pressing the interconnect on to the wafers with a hold-down member which is axially displaceable through the passage in the magnetic field concentrator.

\* \* \* \* \*